(12) United States Patent
Oliver et al.

(10) Patent No.: US 7,923,298 B2
(45) Date of Patent: Apr. 12, 2011

(54) IMAGER DIE PACKAGE AND METHODS OF PACKAGING AN IMAGER DIE ON A TEMPORARY CARRIER

(75) Inventors: Steven Oliver, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 529 days.

(21) Appl. No.: 11/851,787

(22) Filed: Sep. 7, 2007

(65) Prior Publication Data
US 2009/0068798 A1   Mar. 12, 2009

(51) Int. Cl.
  *H01L 21/56* (2006.01)
  *H01L 31/048* (2006.01)
(52) U.S. Cl. .................. 438/114; 438/26; 438/126
(58) Field of Classification Search .......... 438/27, 438/127
  See application file for complete search history.

(56) References Cited

U.S. PATENT DOCUMENTS

| | | |
|---|---|---|
| 3,976,288 A | 8/1976 | Cuomo, Jr. |
| 4,463,073 A | 7/1984 | Miyauchi et al. |
| 4,575,330 A | 3/1986 | Hull |
| 4,925,515 A | 5/1990 | Yoshimura et al. |
| 4,929,402 A | 5/1990 | Hull |
| 4,996,010 A | 2/1991 | Modrek |
| 4,999,143 A | 3/1991 | Hull et al. |
| 5,015,424 A | 5/1991 | Smalley |
| 5,058,988 A | 10/1991 | Spence |
| 5,059,021 A | 10/1991 | Spence et al. |
| 5,059,359 A | 10/1991 | Hull et al. |
| 5,076,974 A | 12/1991 | Modrek et al. |
| 5,087,964 A | 2/1992 | Hatta |
| 5,096,530 A | 3/1992 | Cohen |
| 5,104,592 A | 4/1992 | Hull et al. |
| 5,123,734 A | 6/1992 | Spence et al. |
| 5,130,064 A | 7/1992 | Smalley et al. |
| 5,133,987 A | 7/1992 | Spence et al. |
| 5,141,680 A | 8/1992 | Almquist et al. |
| 5,143,663 A | 9/1992 | Leyden et al. |
| 5,164,128 A | 11/1992 | Modrek |
| 5,173,220 A | 12/1992 | Reiff et al. |

(Continued)

FOREIGN PATENT DOCUMENTS

JP   2006-041183   2/2006

(Continued)

OTHER PUBLICATIONS

International Search Report for International Application No. PCT/US2008/074594 (WO 2009/035858), Mailed Mar. 24, 2009.

(Continued)

*Primary Examiner* — Zandra Smith
*Assistant Examiner* — Pamela E Perkins
(74) *Attorney, Agent, or Firm* — TraskBritt

(57) ABSTRACT

Methods for fabricating an imager die package and resulting die packages are disclosed. An imager die packaging process may include dicing through a fabrication substrate comprising a plurality of imager die. Thereafter, known good die (KGD) qualified from the imager die are repopulated, face down on a high temperature-compatible temporary carrier, the KGD on the temporary carrier are encapsulated and thereafter removed as a reconstructed wafer from the temporary carrier. Furthermore, a first plurality of discrete conductive elements on a back side of the reconstructed wafer may be partially exposed and, optionally, a second plurality of discrete conductive elements may be applied to the first plurality of discrete conductive elements. The encapsulated KGD are then singulated.

25 Claims, 10 Drawing Sheets

U.S. PATENT DOCUMENTS

| | | |
|---|---|---|
| 5,174,931 A | 12/1992 | Almquist et al. |
| 5,174,943 A | 12/1992 | Hull |
| 5,182,055 A | 1/1993 | Allison et al. |
| 5,182,056 A | 1/1993 | Spence et al. |
| 5,182,715 A | 1/1993 | Vorgitch et al. |
| 5,184,307 A | 2/1993 | Hull et al. |
| 5,192,469 A | 3/1993 | Smalley et al. |
| 5,192,559 A | 3/1993 | Hull et al. |
| 5,209,878 A | 5/1993 | Smalley et al. |
| 5,234,636 A | 8/1993 | Hull et al. |
| 5,236,637 A | 8/1993 | Hull |
| 5,238,639 A | 8/1993 | Vinson et al. |
| 5,248,456 A | 9/1993 | Evans, Jr. et al. |
| 5,256,340 A | 10/1993 | Allison et al. |
| 5,258,146 A | 11/1993 | Almquist et al. |
| 5,264,061 A | 11/1993 | Juskey et al. |
| 5,267,013 A | 11/1993 | Spence |
| 5,273,691 A | 12/1993 | Hull et al. |
| 5,321,622 A | 6/1994 | Snead et al. |
| 5,344,298 A | 9/1994 | Hull |
| 5,345,391 A | 9/1994 | Hull et al. |
| 5,358,673 A | 10/1994 | Heller et al. |
| 5,378,508 A | 1/1995 | Castro et al. |
| 5,439,622 A | 8/1995 | Pennisi et al. |
| 5,447,822 A | 9/1995 | Hull et al. |
| 5,460,703 A | 10/1995 | Nulman et al. |
| 5,481,470 A | 1/1996 | Snead et al. |
| 5,495,328 A | 2/1996 | Spence et al. |
| 5,501,824 A | 3/1996 | Almquist et al. |
| 5,547,906 A | 8/1996 | Badehi |
| 5,554,336 A | 9/1996 | Hull |
| 5,555,476 A | 9/1996 | Suzuki et al. |
| 5,556,590 A | 9/1996 | Hull |
| 5,569,349 A | 10/1996 | Almquist et al. |
| 5,569,431 A | 10/1996 | Hull |
| 5,571,471 A | 11/1996 | Hull |
| 5,573,722 A | 11/1996 | Hull |
| 5,600,181 A | 2/1997 | Scott et al. |
| 5,609,812 A | 3/1997 | Childers et al. |
| 5,609,813 A | 3/1997 | Allison et al. |
| 5,610,824 A | 3/1997 | Vinson et al. |
| 5,622,634 A | 4/1997 | Noma et al. |
| 5,630,981 A | 5/1997 | Hull |
| 5,637,169 A | 6/1997 | Hull et al. |
| 5,651,934 A | 7/1997 | Almquist et al. |
| 5,659,478 A | 8/1997 | Pennisi et al. |
| 5,667,820 A | 9/1997 | Heller et al. |
| 5,672,312 A | 9/1997 | Almquist et al. |
| 5,675,402 A | 10/1997 | Cho et al. |
| 5,676,904 A | 10/1997 | Almquist et al. |
| 5,688,464 A | 11/1997 | Jacobs et al. |
| 5,693,144 A | 12/1997 | Jacobs et al. |
| 5,695,707 A | 12/1997 | Almquist et al. |
| 5,705,016 A | 1/1998 | Senoo et al. |
| 5,711,911 A | 1/1998 | Hull |
| 5,776,409 A | 7/1998 | Almquist et al. |
| 5,779,967 A | 7/1998 | Hull |
| 5,814,265 A | 9/1998 | Hull |
| 5,818,005 A | 10/1998 | Pratt et al. |
| 5,827,394 A | 10/1998 | Lu |
| 5,833,869 A | 11/1998 | Haas et al. |
| 5,854,748 A | 12/1998 | Snead et al. |
| 5,855,718 A | 1/1999 | Nguyen et al. |
| 5,855,836 A | 1/1999 | Leyden et al. |
| 5,869,354 A | 2/1999 | Leedy |
| 5,885,511 A | 3/1999 | Heller et al. |
| 5,897,825 A | 4/1999 | Fruth et al. |
| 5,902,537 A | 5/1999 | Almquist et al. |
| 5,902,538 A | 5/1999 | Kruger et al. |
| 5,904,889 A | 5/1999 | Serbin et al. |
| 5,933,190 A | 8/1999 | Dierickx et al. |
| 5,937,265 A | 8/1999 | Pratt et al. |
| 5,943,235 A | 8/1999 | Earl et al. |
| 5,945,058 A | 8/1999 | Manners et al. |
| 5,953,590 A | 9/1999 | Piper et al. |
| 5,969,424 A | 10/1999 | Matsuki et al. |
| 5,985,523 A | 11/1999 | Patton |
| 5,998,867 A | 12/1999 | Jensen et al. |
| 6,039,830 A | 3/2000 | Park et al. |
| 6,048,948 A | 4/2000 | Tochioka |
| 6,099,783 A | 8/2000 | Scranton et al. |
| 6,140,151 A | 10/2000 | Akram |
| 6,150,240 A | 11/2000 | Lee et al. |
| 6,245,646 B1 | 6/2001 | Roberts |
| 6,251,488 B1 | 6/2001 | Miller et al. |
| 6,259,962 B1 | 7/2001 | Gothait |
| 6,266,874 B1 | 7/2001 | DiStefano et al. |
| 6,268,584 B1 | 7/2001 | Keicher et al. |
| 6,283,997 B1 | 9/2001 | Garg et al. |
| 6,284,072 B1 | 9/2001 | Ryan et al. |
| 6,297,138 B1 | 10/2001 | Rimai et al. |
| 6,303,469 B1 | 10/2001 | Larson et al. |
| 6,307,243 B1 | 10/2001 | Rhodes |
| 6,322,598 B1 | 11/2001 | Meuris et al. |
| 6,323,295 B1 | 11/2001 | Muhlebach et al. |
| 6,323,436 B1 | 11/2001 | Hedrick et al. |
| 6,326,698 B1 | 12/2001 | Akram |
| 6,337,122 B1 | 1/2002 | Grigg et al. |
| 6,344,402 B1 | 2/2002 | Sekiya |
| 6,353,257 B1 | 3/2002 | Huang |
| 6,391,251 B1 | 5/2002 | Keicher et al. |
| 6,399,464 B1 | 6/2002 | Muntifering et al. |
| 6,403,168 B2 | 6/2002 | Meyer et al. |
| 6,407,334 B1 | 6/2002 | Jimarez et al. |
| 6,417,022 B1 | 7/2002 | Hsiao |
| 6,432,752 B1 | 8/2002 | Farnworth |
| 6,465,329 B1 | 10/2002 | Glenn |
| 6,468,891 B2 | 10/2002 | Williams |
| 6,471,806 B1 | 10/2002 | McKenna et al. |
| 6,472,294 B2 | 10/2002 | Meuris et al. |
| 6,482,576 B1 | 11/2002 | Farnworth et al. |
| 6,483,719 B1 | 11/2002 | Bachman |
| 6,498,074 B2 | 12/2002 | Siniaguine et al. |
| 6,500,746 B2 | 12/2002 | Williams |
| 6,509,636 B1 | 1/2003 | Tsai et al. |
| 6,514,798 B2 | 2/2003 | Farnworth |
| 6,518,662 B1 | 2/2003 | Smith et al. |
| 6,521,844 B1 | 2/2003 | Fuemiss et al. |
| 6,524,346 B1 | 2/2003 | Farnworth |
| 6,524,881 B1 | 2/2003 | Tandy et al. |
| 6,529,027 B1 | 3/2003 | Akram et al. |
| 6,537,482 B1 | 3/2003 | Farnworth |
| 6,544,465 B1 | 4/2003 | Farnworth et al. |
| 6,544,821 B2 | 4/2003 | Akram |
| 6,544,902 B1 | 4/2003 | Farnworth |
| 6,549,821 B1 | 4/2003 | Farnworth et al. |
| 6,551,906 B2 | 4/2003 | Oka |
| 6,562,278 B1 | 5/2003 | Farnworth et al. |
| 6,562,661 B2 | 5/2003 | Grigg |
| 6,569,373 B2 | 5/2003 | Napadensky |
| 6,569,709 B2 | 5/2003 | Derderian |
| 6,569,753 B1 | 5/2003 | Akram et al. |
| 6,582,983 B1 | 6/2003 | Runyon et al. |
| 6,585,927 B2 | 7/2003 | Grigg et al. |
| 6,593,171 B2 | 7/2003 | Farnworth |
| 6,607,689 B1 | 8/2003 | Farnworth |
| 6,611,053 B2 | 8/2003 | Akram |
| 6,632,732 B2 | 10/2003 | Williams |
| 6,644,763 B1 | 11/2003 | Gothait |
| 6,649,991 B1 | 11/2003 | Chen et al. |
| 6,658,314 B1 | 12/2003 | Gothait |
| 6,677,238 B2 | 1/2004 | Seki |
| 6,686,225 B2 | 2/2004 | Wachtler |
| 6,696,363 B2 | 2/2004 | Lee et al. |
| 6,696,752 B2 | 2/2004 | Su et al. |
| 6,713,857 B1 | 3/2004 | Tsai |
| 6,734,032 B2 | 5/2004 | Tandy et al. |
| 6,740,962 B1 | 5/2004 | Grigg |
| 6,746,899 B2 | 6/2004 | Grigg |
| 6,762,502 B1 | 7/2004 | Akram |
| 6,764,933 B2 | 7/2004 | Williams |
| 6,764,935 B2 | 7/2004 | Williams |
| 6,767,815 B2 | 7/2004 | Williams |
| 6,780,744 B2 | 8/2004 | Williams |
| 6,833,627 B2 | 12/2004 | Farnworth |
| 6,849,915 B1 | 2/2005 | Tsai |
| 6,875,640 B1 | 4/2005 | Farnworth et al. |

| | | |
|---|---|---|
| 6,885,107 B2 | 4/2005 | Kinsman |
| 6,893,904 B2 | 5/2005 | Akram |
| 6,897,096 B2 | 5/2005 | Cobbley et al. |
| 6,908,784 B1 | 6/2005 | Farnworth |
| 6,911,173 B2 | 6/2005 | Farnworth |
| 6,940,181 B2 | 9/2005 | Derderian et al. |
| 6,949,834 B2 | 9/2005 | Connell et al. |
| 6,963,127 B2 | 11/2005 | Akram |
| 7,041,513 B2 | 5/2006 | Akram |
| 7,043,830 B2 | 5/2006 | Farnworth |
| 7,057,832 B2 | 6/2006 | Wu et al. |
| 7,064,010 B2 * | 6/2006 | Farnworth et al. ............ 438/114 |
| 7,071,084 B2 | 7/2006 | Yokoyama et al. |
| 7,084,474 B2 | 8/2006 | Hung et al. |
| 7,087,984 B2 | 8/2006 | Akram |
| 7,112,471 B2 | 9/2006 | Boon et al. |
| 7,138,695 B2 | 11/2006 | Kim et al. |
| 7,169,703 B2 | 1/2007 | Aomori |
| 7,215,015 B2 | 5/2007 | Moden |
| 7,221,051 B2 | 5/2007 | Ono et al. |
| 7,253,028 B2 | 8/2007 | Liu |
| 2001/0036718 A1 | 11/2001 | Williams |
| 2001/0051395 A1 | 12/2001 | Grigg |
| 2002/0016387 A1 | 2/2002 | Shen |
| 2002/0123213 A1 | 9/2002 | Williams |
| 2002/0159242 A1 | 10/2002 | Nakatani et al. |
| 2002/0171177 A1 | 11/2002 | Kritchman et al. |
| 2002/0176793 A1 | 11/2002 | Moussa et al. |
| 2003/0043360 A1 | 3/2003 | Farnworth |
| 2003/0045047 A1 | 3/2003 | Williams |
| 2003/0059708 A1 | 3/2003 | Yamamura et al. |
| 2003/0068840 A1 | 4/2003 | Grigg |
| 2003/0151167 A1 | 8/2003 | Kritchman et al. |
| 2003/0232461 A1 | 12/2003 | Bolken |
| 2004/0018709 A1 | 1/2004 | Williams |
| 2004/0165362 A1 | 8/2004 | Farnworth |
| 2004/0229002 A1 | 11/2004 | Davis et al. |
| 2005/0059188 A1 | 3/2005 | Bolken et al. |
| 2005/0064681 A1 | 3/2005 | Wood et al. |
| 2005/0064683 A1 | 3/2005 | Farnworth |
| 2005/0082651 A1 | 4/2005 | Farnworth et al. |
| 2005/0218518 A1 | 10/2005 | Jiang et al. |
| 2005/0231626 A1 | 10/2005 | Tuttle et al. |
| 2005/0277231 A1 | 12/2005 | Hembree et al. |
| 2006/0035415 A1 | 2/2006 | Wood et al. |
| 2006/0043599 A1 | 3/2006 | Akram et al. |
| 2006/0044433 A1 | 3/2006 | Akram |
| 2006/0261458 A1 | 11/2006 | Paek et al. |

FOREIGN PATENT DOCUMENTS

WO    WO 8806494    9/1988

OTHER PUBLICATIONS

Miller, Doyle, "New Laser-Directed Deposition Technology," Microelectronic Fabrication, www.hdi-online.com, HDI, p. 16, Aug. 2001.
Miller, Doyle, et al, "Maskless Mesoscale Materials Deposition," Deposition Technology, www.hdi-online.com, HDI, pp. 20-22, Sep. 2001.
ObjetTM FullCureTM 700 Series, Photopolymer Materials and Support Resins (2 pages), © 2003 Objet Geometries, Ltd. ObjetTM, etc. Objet Prototyping the Future, How it Works (2 pages), 2003 by Objet Geometries Ltd. Ltd.
PNI/Plastics News International, Applied Machinery Pty Ltd, Buy & Sell Plastics Machinery, Jan. 10, 2004, www.plasticsnews.net.
Oliver et al., Semiconductor Constructions and Assemblies, Electronic Systems, and Methods of Forming Semiconductor Constructions and Assemblies, U.S. Appl. No. 11/483,002, filed Jul. 6, 2006.
Stereolithography Resin is Optically Clear, www.manufacturingtalk.com/news/dsm/dsm103.html, Aug. 3, 2001, pp. 1-2.

* cited by examiner

IMAGER DIE PACKAGE AND METHODS OF PACKAGING AN IMAGER DIE ON A TEMPORARY CARRIER

FIELD OF INVENTION

Embodiments of the present invention relate generally to packaging of optically interactive microelectronic devices. More specifically, embodiments of the present invention relate to an imager die package sealed within an encapsulant and to methods of packaging an imager die.

BACKGROUND

Microelectronic imagers are well known to those having skill in the electronics/photonics art, as they are used in digital cameras, wireless devices with picture capabilities, and many other applications. Cellular telephones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other solid state systems. CCD image sensors have been widely used in digital cameras and other applications. CMOS image sensors are quickly becoming very popular because they have low production costs, high yields, and small sizes, CMOS image sensors, as well as CCD image sensors, are accordingly "packaged" to protect the delicate components and to provide external electrical contacts. Optically interactive microelectronic devices require packaging that provides protection from other environmental conditions while allowing light or other forms of radiation to pass through to a surface where sensing circuitry is located. One problem with conventional packaging techniques of microelectronic devices is that the final packages produced allow for the exposure of the image sensor to amounts of unwanted peripheral light.

Furthermore, the materials and structures involved in conventional semiconductor packaging techniques require fabrication processes that can be time consuming and require several precision assembly steps. Each assembly step increases the opportunity for contamination or damage to the imaging device itself, raising defect levels and slowing production time to avoid such damage and contamination. Additionally, if the package design or fabrication approach necessitates that all of the imager die located on a wafer be packaged regardless of whether a significant number of die are defective, a substantial waste of material results. Due to the extremely cost-competitive nature of the semiconductor industry, improvements in product yield and production time are of value, especially when considered in terms of the high volume of components being manufactured.

There is a need for methods to both improve the quality, and decrease the cost, of an imaging device. Specifically, there is a need for providing a method that enables low-cost, high volume encapsulated packaging of imager die while providing a high quality imaging device.

DETAILED DESCRIPTION

Figure 1:
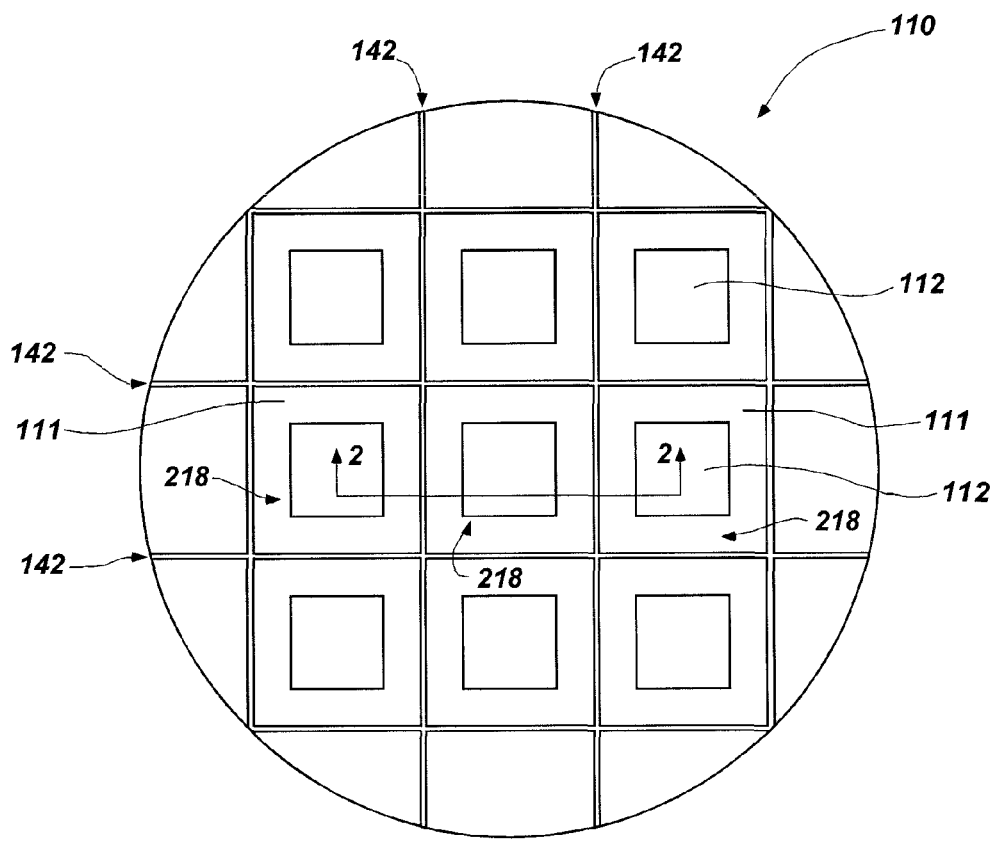
FIG. 1 is a top view of a semiconductor imager wafer having an array of multiple discrete imager die attached thereon, according to an embodiment of the invention.

Embodiments of the invention include methods for packaging imager die and imager die packages. An imager die packaging method may utilize a temporary carrier during an encapsulation process. In a specific embodiment, the carrier may include a high temperature compatible film frame tape and an ultraviolet-releasable adhesive.

An embodiment of the invention includes a method of packaging an imager die. The method includes cutting through a thickness of a fabrication substrate between adjacent imager die carried by the fabrication substrate to form a plurality of individual imager die. The method further includes securing a plurality of known good die characterized from the plurality of individual imager die to a temporary carrier and at least partially encapsulating the plurality of known good die on the temporary carrier to reconstruct a wafer. The method also includes singulating the at least partially encapsulated plurality of known good die from the wafer. In a particular embodiment, a temporary carrier includes an ultraviolet-sensitive adhesive on a surface of a film formed from a material configured to withstand relatively high process temperatures. (e.g., temperatures of about 90° C. or greater).

Another embodiment of the invention includes an imager die package comprising a fabrication substrate having an active surface and a back side with an imager die having an image sensor formed on the active surface. The package further includes at least one conductive interconnect extending from the active surface to the back side of the fabrication substrate. Furthermore, the package may comprise an encapsulant formed at least partially around the fabrication substrate including the imager die.

According to yet another embodiment, the invention includes an electronic system comprising a processor-based device operably coupled to an imager die package according to an embodiment of the invention.

Another embodiment of the invention includes a known good die wafer comprising a plurality of known good imager die. Each known good die is fabricated on an active surface of one fabrication substrate of a plurality and a back side of each fabrication substrate includes circuit traces thereon. The known good die wafer further includes a first plurality of discrete conductive elements respectively formed on the circuit traces and an encapsulant at least partially formed around each known good imager die of the plurality.

Referring in general to the accompanying drawings, various aspects of the present invention are illustrated to show the structure and methods of packaging an imager die. Common elements of the illustrated embodiments are designated with like numerals. It should be understood that the figures presented are not meant to be illustrative of actual views of any particular portion of the actual device structure, but are merely schematic representations that are employed to more clearly and fully depict the invention. It should be further understood that while depicted and described in the context of an image sensor, the package embodiments and methods presented herein would work well for enclosing other types of optically interactive devices, such as, but not limited to, CCD and CMOS image sensors, electrically erasable programmable read-only memory (EPROM), and photodiodes, as well as light-emitting devices including semiconductor lasers and light-emitting diodes.

The fabrication of an imager die package according to an embodiment of the present invention is illustrated by FIGS. 1 through 8. Referring to FIG. 1, a semiconductor wafer 110 is illustrated at a preliminary processing stage. The wafer construction is subdivided into a plurality of die regions 218, which are separated from one another, and bounded, by streets 142. Each of the die regions 218 is, conventionally, processed identically to form a plurality of identical die. Each die region 218 includes an active surface 111 having an image sensitive area 112, which comprises sensing circuitry reactive to light or other forms of radiation.

Figure 2:
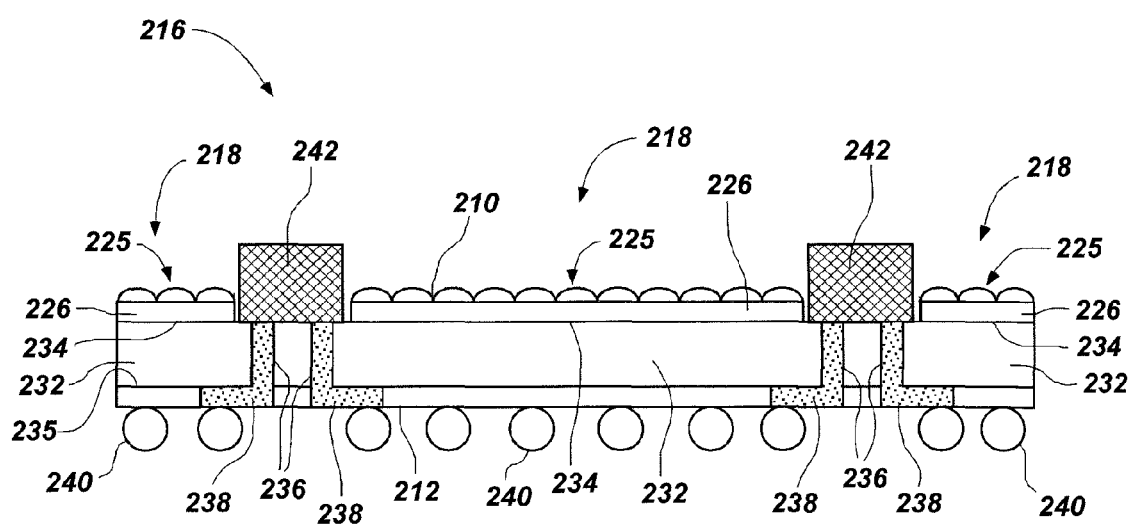
FIG. 2 is a cross-sectional view of an imager wafer according to an embodiment of the invention.

FIG. 2 illustrates a cross-sectional view of a through wafer interconnect (TWI) wafer 216 taken along line 2 of FIG. 1. The term "through wafer interconnect" may be used herein to describe a substrate having vias extending therethrough and lined or filled with conductive material for forming interconnects for connecting circuitry on one side of a portion of the substrate to circuitry on the other side thereof, or to external circuitry. TWI wafer 216 includes a first surface 210 and a second surface 212. TWI wafer 216 may comprise a fabrication substrate 232 having a plurality of die regions 218 formed on an active surface thereof, and each die region 218 may comprise imager die 226. Imager die 226 may each comprise an image sensor 225, such as, but not limited to, a CMOS imager. By way of example only, fabrication substrate 232 may comprise a full or partial wafer of semiconductive material (e.g., silicon, gallium arsenide, indium phosphide, etc.), a silicon-on-insulator (SOI) type substrate (e.g., silicon-on-ceramic (SOC), silicon-on-glass (SOG), silicon-on-sapphire (SOS), etc.), or any other bulk or large-scale substrate upon which a plurality of semiconductor device components may be fabricated.

TWI wafer 216 may include a plurality of standoffs 242 secured to fabrication substrate 232 and comprising of, for example, a photopolymerized material. Standoffs 242 may be configured to provide spacing between imager die 226 and a subsequently attached layer, such as a cover glass or a lens. TWI wafer 216 may also comprise at least one conductive interconnect 236 located between adjacent die and extending from the active surface 234 to a back side 235 of fabrication substrate 232 and in contact with a redistribution layer (RDL). RDL may be in the form of conductive traces 238 formed at the second surface 212 of TWI wafer 216. In addition, TWI wafer 216 may comprise a first plurality of discrete conductive elements 240 conventionally formed or disposed on and respectively in contact with conductive traces 238. For example only, and not by way of limitation, first plurality of discrete conductive elements 240 may comprise solder balls, or bumps, studs, pillars or columns formed or covered with a conductive material, or formed of a conductor-filled material. The above description represents only one example of a TWI wafer and any other configurations known in the art are within the scope of the present invention.

Figure 3A:
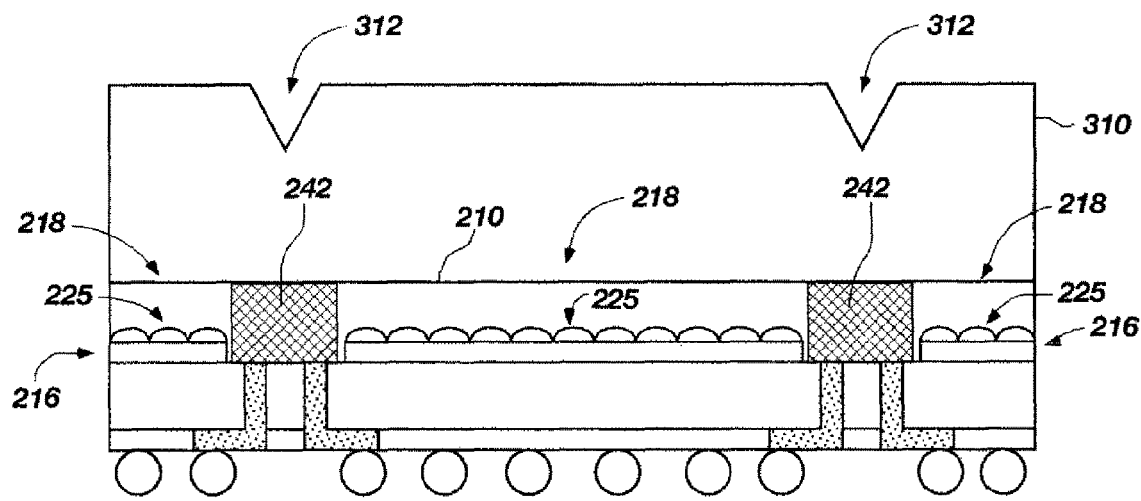
FIGS. 3(a) and 3(b) are cross-sectional views of an imager wafer with an attached glass layer according to an embodiment of the invention.
Figure 3B:
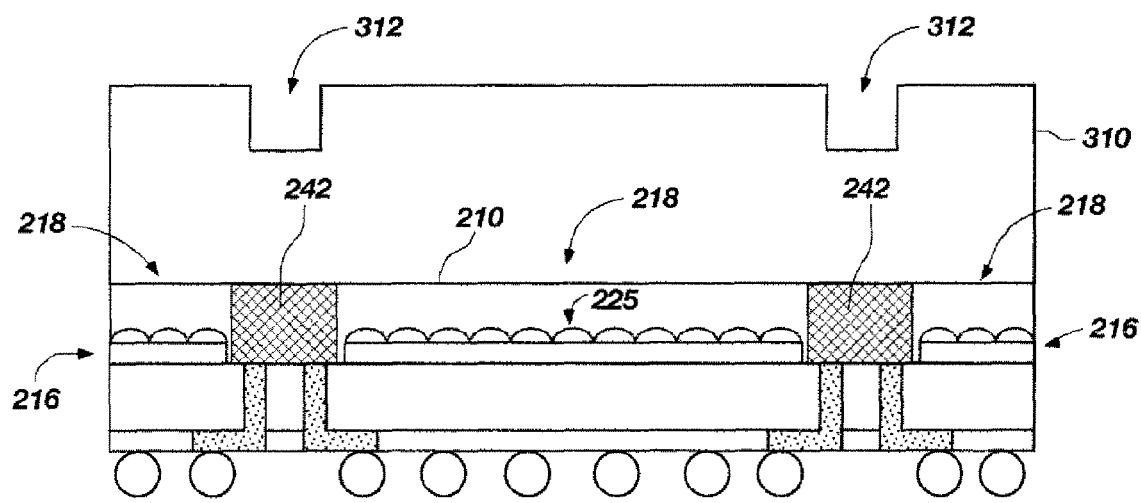

FIG. 3(a) illustrates an embodiment of a TWI wafer 216 with a glass layer 310 or sheet of another suitable transparent material attached. Glass layer 310 may be of a size sufficient to cover the array of imager die active surfaces 111 (see FIG. 1) and is attached to and peripherally supported about each die region 218 by the plurality of standoffs 242. Glass layer 310 may be formed of an at least partially optically transparent material such as borosilicate glass (BSG). Other types of glass that allow the passage of a desired range of wavelengths of light or other forms of electromagnetic radiation may also be used. Glass layer 310 may comprise cuts 312 in the form of notches that may be formed before or after glass layer 310 is attached to TWI wafer 216. As described in more detail below, cuts 312 are configured to minimize the peripheral light received by image sensor 225 and, therefore, increase the quality of image sensor 225. Cuts 312 may be formed by a scoring blade (not shown) wherein the groove depth of cuts 312 may depend on the size of the scoring blade and the depth of penetration of the scoring blade into glass layer 310. Additionally, the angle at which cuts 312 are formed in glass layer 310 may depend, in part, on the shape of the scoring blade. The shape of cuts 312 is not limited to a cut having angled or beveled edges, as depicted but, rather, cuts 312 may have a generally square or rectangular shape, as illustrated in FIG. 3(b). In the event the cuts 312 are formed after glass layer 310 has been attached to wafer 110, standoffs 242 may be configured to withstand some compressive force as applied by the scoring blade.

Figure 3C:
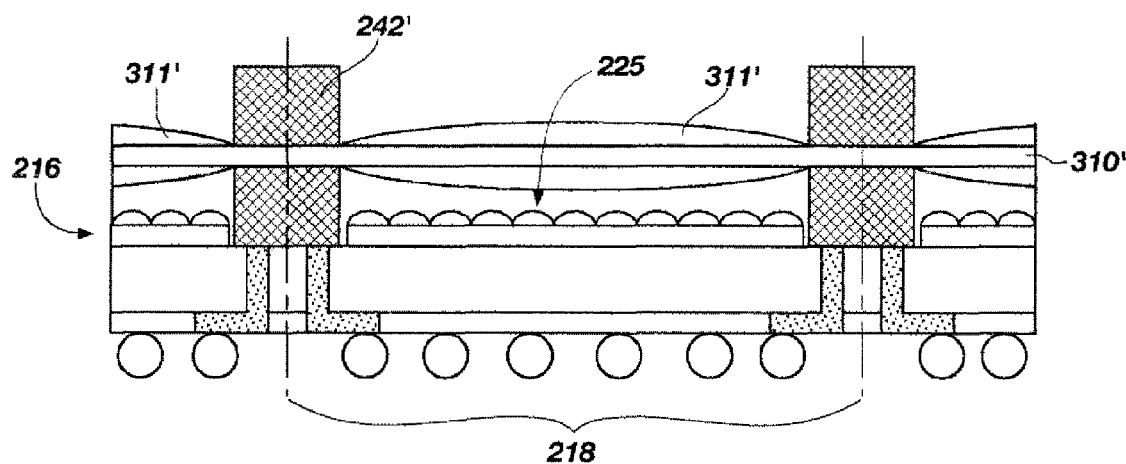
FIG. 3(c) is a cross-sectional view of an imager wafer with an attached lens-carrying substrate according to other embodiments of the invention.

In other embodiments, instead of a glass layer 310, a substrate 310' formed from glass or another suitable transparent material that carries a plurality of lenses 311' or other optical elements may be positioned over TWI wafer 216, as shown in FIG. 3(c). Each lens 311' is aligned over an image sensor 225 of a die region 218. In embodiments where lenses 311' protrude from an outer surface of glass substrate 310', additional standoffs 242' may be formed or positioned around each lens 311' to facilitate further processing in accordance with teachings of the present invention (e.g., prevent encapsulant from contacting each lens 311'.

Figure 4:
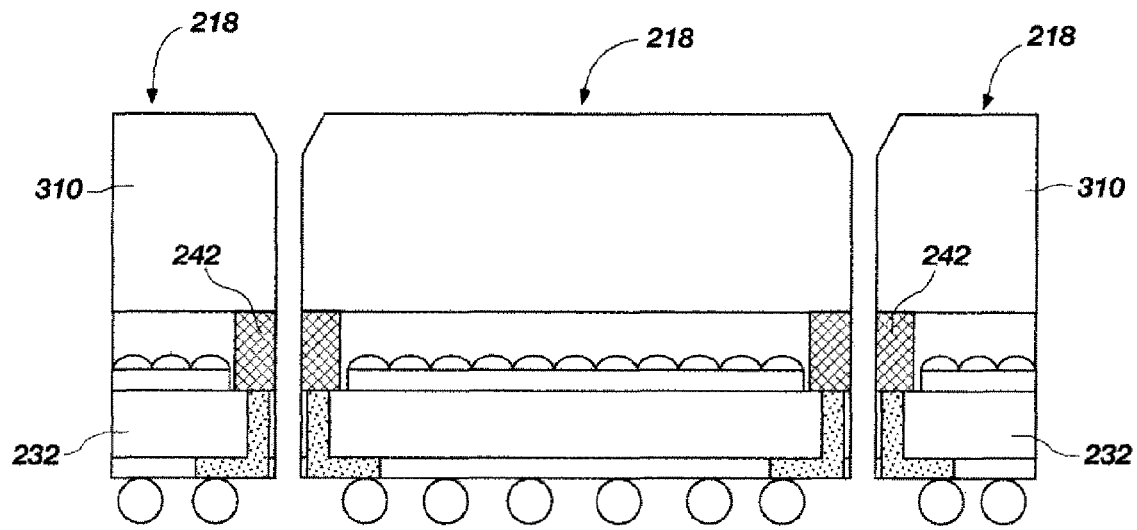
FIG. 4 is a cross-sectional view of an imager wafer with an attached glass layer after a dicing operation according to an embodiment of the invention.

Subsequent to attaching glass layer 310 (or lens 311', bearing glass substrate 310') to the plurality of standoffs 242, glass layer 310, standoffs 242, and fabrication substrate 232 may be cut by way of a dicing operation carried out to form a plurality of individualized imager die regions 218 (See FIG. 4). Cutting of glass layer 310 may be accomplished, in some embodiments, using a resinoid blade saw. Cutting of fabrication substrate 232 may be accomplished, in a more specific embodiment, using a diamond plated nickel saw. In another embodiment of the present invention, fabrication substrate 232, standoffs 242 and glass layer 310 may be cut by a "stealth" dicing process wherein the fabrication substrate 232, standoffs 242 and glass layer 310 are weakened at an internal region by one or more lasers and thereafter the glass layer 310, standoffs 242 and fabrication substrate 232 are stretched and broken at the weakened internal region. The stealth dicing process is developed by Hamamatsu Photonics K.K., Shizuoka, Japan. An alternative dicing process may be effected using a water-jet-guided laser available from Synova S. A., Lausanne, Switzerland. In other embodiments, the imager singulation process may be achieved by a jet singulation system wherein a jet stream of an abrasive slurry is used to singulate component parts. The jet singulation system may be made by Towa Intercon Technology, Inc., of Morgan Hill, Calif. Prior to or after the dicing operation is completed, individual imager die may be tested to ascertain which of the imager die are operational and meet qualitative performance standards and are thus deemed "good," and which are defective. The imager die that are good can be considered to be "known good die" (KGD). Upon determining the KGD, the KGD may be placed on a temporary carrier 410 (See FIG. 5).

Figure 5:
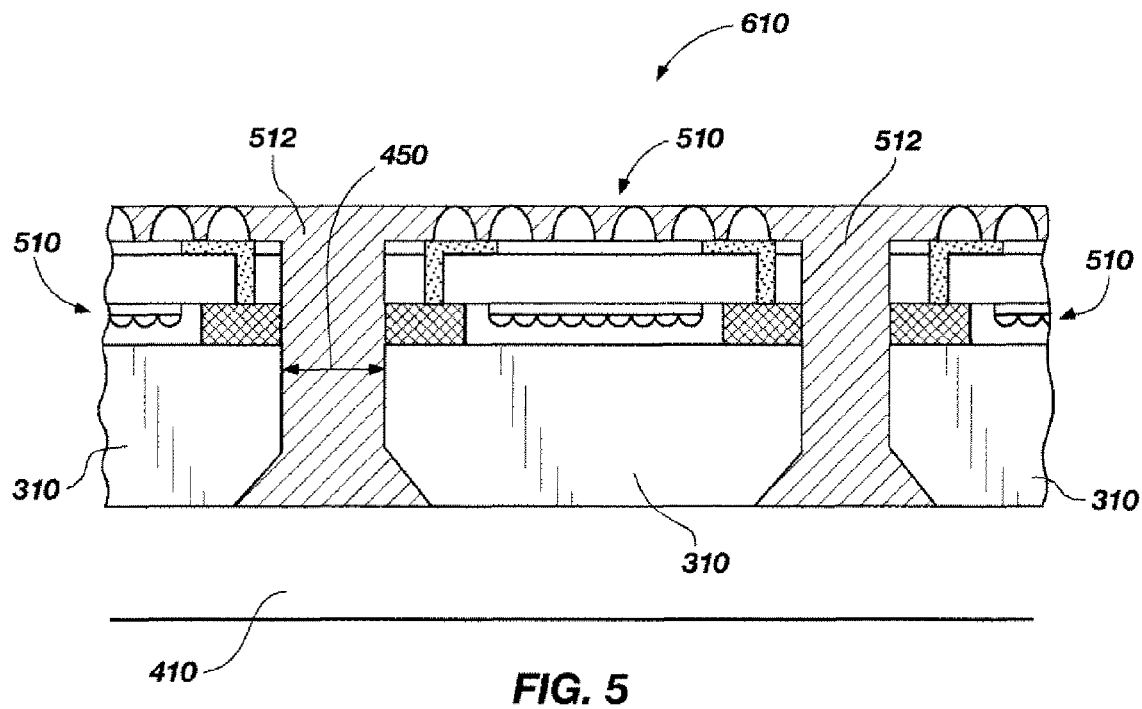
FIG. 5 is a cross-sectional view of a reconstructed wafer including a plurality of imager die attached to a temporary carrier according to an embodiment of the invention.

FIG. 5 illustrates KGD 510 populated on a temporary carrier 410. According to some embodiments, temporary carrier 410 comprises a film frame tape or a glass carrier. Temporary carrier 410 may comprise a high temperature compatible polyethylene terephthalate (PET) material that may withstand relatively high process temperatures (i.e., temperatures above about 90° C.). In addition, temporary carrier 410 may comprise a pressure sensitive adhesive. Furthermore, temporary carrier 410 may comprise an ultraviolet-sensitive adhesive, which loses adhesive strength when irradiated with a select wavelength of light, normally UV light. Use of an ultraviolet-type tape may be desirable since, when irradiated, it loses its adherent properties and thus reduces stress on the dice during a subsequent pick-and-place operation. Ultraviolet sensitive tapes are commercially available from Furukawa Electric Company, Ltd. of Japan.

As shown, KGD 510 are placed facedown on temporary carrier 410, and, therefore, FIG. 5 is shown inverted relative to FIGS. 2 through 4. KGD 510 may be positioned on temporary carrier 410 to provide for a desired gap width 450 and, thereafter, KGD 510 may be encapsulated with an encapsulant 512 to form wafer 610. Encapsulant 512 may comprise any conventional compound known for use in encapsulating semiconductor chips that exhibits low moisture uptake and good dimensional stability. Encapsulant 512 may also be selected to have a coefficient of thermal expansion (CTE) that is compatible with those of substrate 232 and KGD 510. For example only, and not by way of limitation, encapsulation of KGD 510 may be effected by a molding process or a dam and fill process. Molding processes known in the art may include injection molding, transfer molding, and compression molding. Injection molding is a process wherein an encapsulant is injected at high pressure into a mold cavity containing the device to be encapsulated. A compression molding process may include placing an encapsulant into a mold cavity containing the device to be encapsulated and thereafter applying pressure and heat. Transfer molding differs from compression molding in that instead of applying pressure to the pre-placed compound, the encapsulant material is preheated and then transferred into a molding cavity under pressure, containing the device to be encapsulated. Dam and fill is a two-step process wherein a dam is dispensed around a device within a cavity and, thereafter, the cavity may be filled with an encapsulant to encapsulate the device. Examples of encapsulant 512 contemplated for use in the present invention include, but are not limited to, thermoset and thermoplastic curable compounds such as silicon-filled polymers or liquid crystal polymers.

Figure 5A:
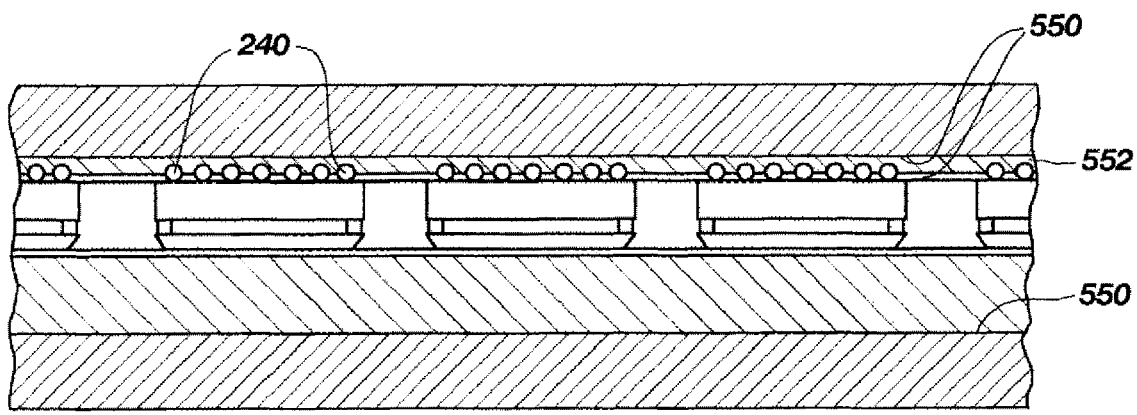
FIG. 5(a) is a cross-sectional view of a reconstructed wafer, including a plurality of imager die on a temporary carrier, positioned within a cavity of a mold according to embodiments of the present invention.

In embodiments where molding processes are used, a surface of a mold cavity may be configured to receive portions of discrete conductive elements 240, which protrude from each KGD 510 to prevent encapsulant from completely covering the discrete conductive elements 240. In one such embodiment, shown in FIG. 5(a), discrete conductive elements 240 may be partially received by a compressible, conformable element 522 (e.g., a polytetrafluoroethylene film, such as the material sold under the trademark TEFLON® by E.I. duPont Nemours & Co. of Wilmington, Del.) that lines at least a portion of a surface of a mold cavity 550. Upon being confined within mold cavity 550, portions of discrete conductive elements 240, which protrude from each KGD 510 within mold cavity 550, are received by compressible, conformable element 552, shielding the received portions of discrete conductive elements 240 from encapsulant 512 as encapsulant 512 is introduced into mold cavity 550. Therefore, upon completion of the mold process and removal of the resulting wafer 610 from mold cavity 550, portions of discrete conductive elements 240 may protrude from an outer surface of encapsulant 512. The distance that discrete conductive elements 240 protrude from the outer surface of the encapsulant may be defined by a depth that discrete conductive elements 240 are received and, thus, in embodiments where a compressible, conformable element 552 is used, by a thickness of compressible, conformable element 552.

In embodiments where a mold cavity is not configured to receive discrete conductive elements 240, as well as in embodiments where dam and fill or other encapsulation processes are used, it may be necessary to expose conductive elements 240 through encapsulant 512. In such embodiments, wafer 610 may be subjected to appropriate processing to form a substantially planarized surface 612 extending across the first plurality of discrete conductive elements 240 and encapsulant 512. The processing may further provide for the at least partial exposure of the first plurality of discrete conductive elements 240. The formation of the substantially planarized surface 612 can be accomplished with any suitable method, and may be accomplished by backgrinding or another mechanical planarization process such as chemical mechanical planarization (CMP). Appropriate control of the planarization process may be required to prevent the smearing of any conductive material of the first plurality of discrete conductive elements 240, which may result in shorting of one conductive element 240 to an adjacent one. After planarizing surface 612, a second plurality of discrete conductive elements 620 (e.g., solder balls, pins, pillars, columns, etc.) may be formed or disposed on, and bonded to, the first plurality of discrete conductive elements 240. The second plurality of discrete conductive elements 620 may provide for subsequent attachment to a carrier substrate or other higher-level circuit assembly, as shown in FIG. 6.

Figure 6:
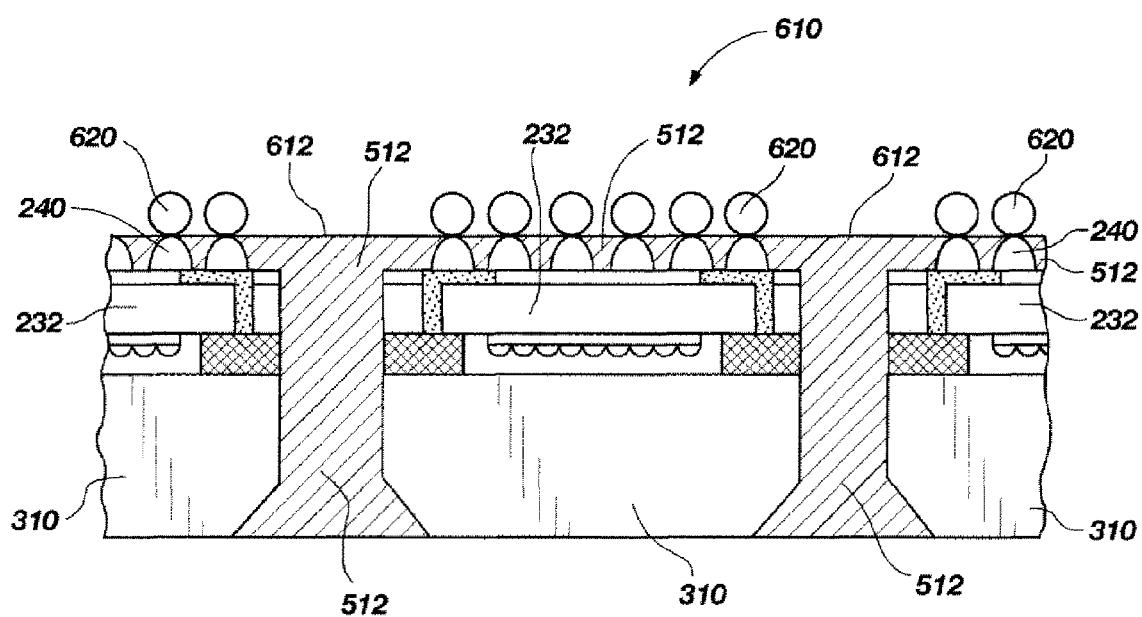
FIG. 6 is a cross-sectional view of a reconstructed wafer including a plurality of encapsulated imager die in accordance with an embodiment of the invention.

FIG. 6 also depicts removal of wafer 610 from temporary carrier 410. Cleaning of adhesive from wafer 610 may be required after separation of wafer 610 from temporary carrier 410. Cleaning methods known in the art, such as, a plasma cleaning technique, may be effected.

Figure 7:
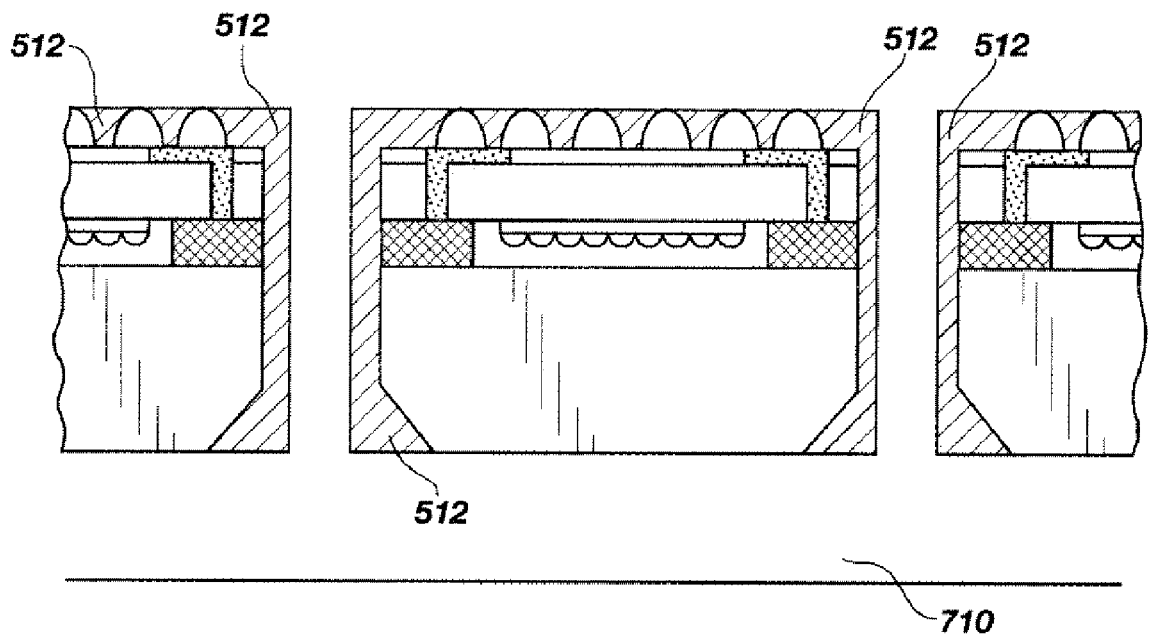
FIG. 7 is a cross-sectional view of a plurality of singulated imager die packages in accordance with an embodiment of the invention.
Figure 8A:
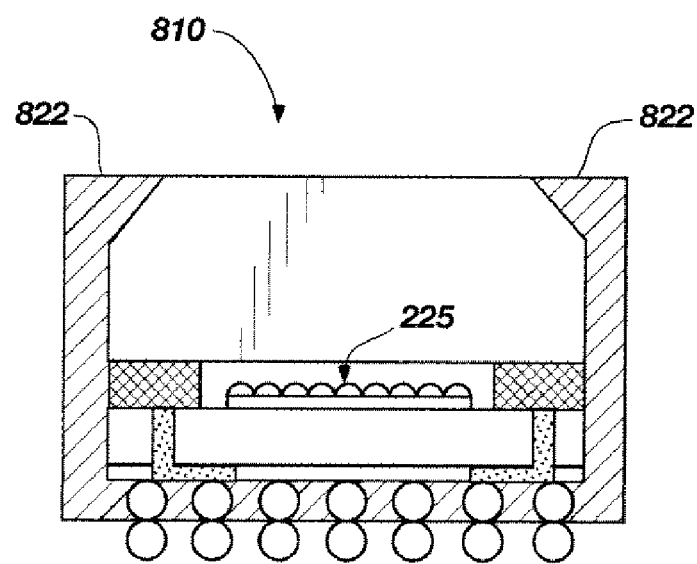
FIGS. 8(a) and 8(b) are cross-sectional views of an imager die package in accordance with an embodiment of the invention.
Figure 8B:
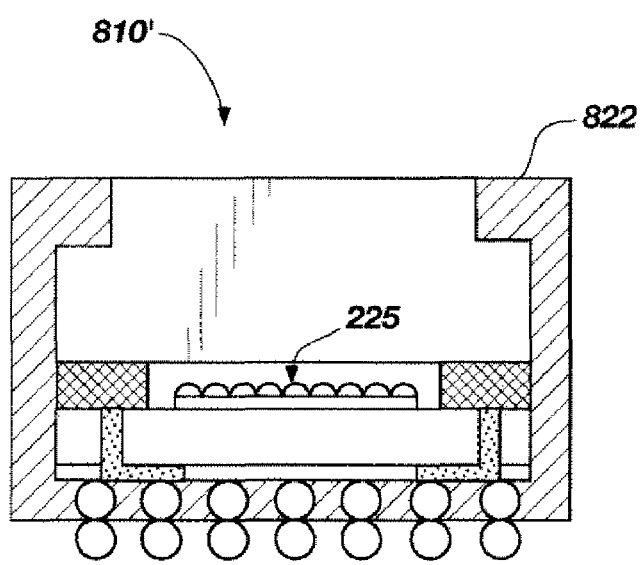

As illustrated in FIG. 7, wafer 610 may then be placed on a dicing tape 710 and singulated by performing a dicing operation through encapsulant 512 and, therefore, resulting in a final packaged die 810/810', as shown in FIGS. 8(a) and 8(b). Final packaged die 810/810' provide for, as a result of cuts 312 (see FIGS. 3(a) and 3(b)), regions 822 that extend laterally over non-imaging regions on the active surface of the final packaged die 810/810'. These laterally extending regions 822 of encapsulant, or packaging material, prevent at least some unwanted, or stray, light from reaching the image sensor 225 and are, therefore, also referred to herein as "lateral light blocking elements." Consequently, the accuracy of an image detected by image sensor 225 may be enhanced in embodiments of final packaged die 810/810' with laterally extending regions 822.

Imager die packages, according to another embodiment of the present invention, may be formed in a manner similar to that described above, except the imager die are not covered with a glass layer. Instead, "known good lenses" (KGL) are identified or qualified, and are subsequently placed over known good imager die. KGD, comprising known good imagers with KGL assembled therewith may then be placed on a temporary carrier, with standoffs that completely circumscribe the periphery of each image sensor 225 contacting the temporary carrier. These assemblies may then be encapsulated by molding or dam and fill processes and, thereafter, singulated to form final die packages.

Figure 9:
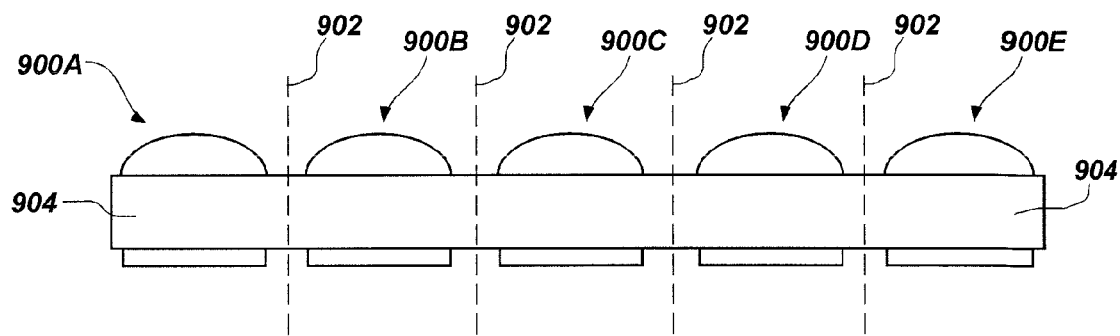
FIG. 9 is a cross-sectional view of a plurality of lenses according to an embodiment of the invention.
Figure 10:
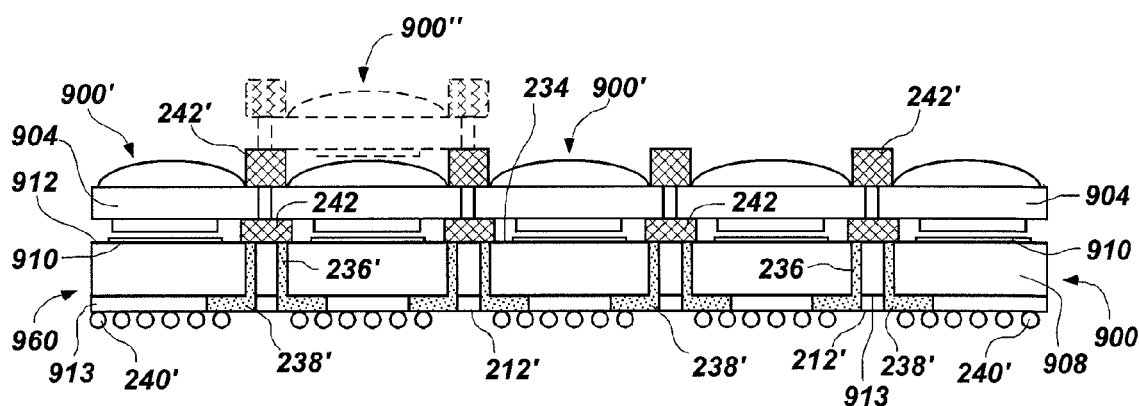
FIG. 10 is a cross-sectional view of a plurality of lenses attached to an imager wafer in accordance with an embodiment of the invention.
Figure 11:
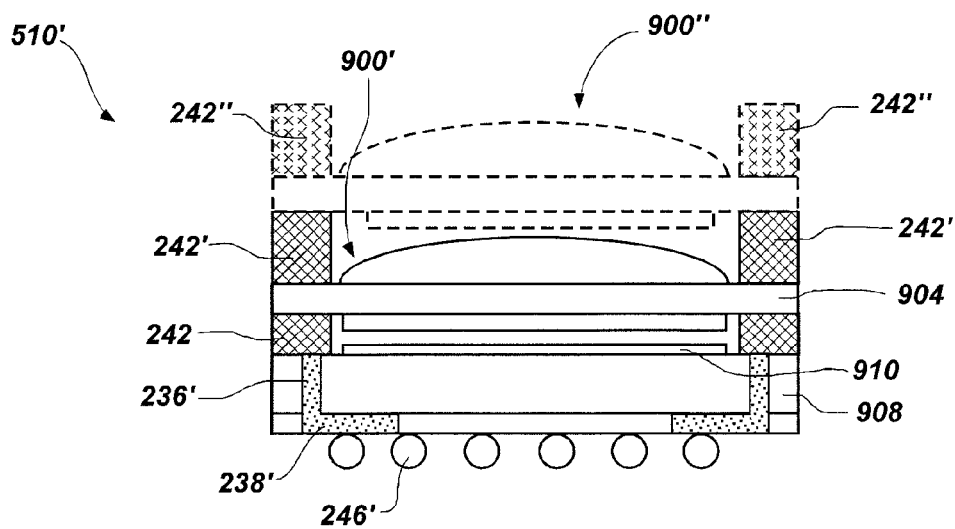
FIG. 11 is a cross-sectional view of an imager die with at least one lens attached thereto according to an embodiment of the invention.

One variant of the second embodiment is shown in FIGS. 9 through 14. FIG. 9 illustrates a plurality of lenses 900A-E formed from a glass substrate 904. Lenses 900A-E may be individually qualified by methods known in the art to ascertain known good lenses. After testing, a dicing operation may be performed along dicing lines 902 resulting in a plurality of individual lenses. As shown in FIG. 10, a plurality of known good lenses 900' may thereafter be individually placed over a plurality of known good imager die 910 located on a TWI wafer 960. As described above in reference to FIGS. 1 through 8 and TWI wafer 216, TWI wafer 960, as illustrated in FIGS. 10 through 14 may comprise a fabrication substrate 908 and at least one conductive interconnect 236' located between adjacent image die 910 and extending from active surface 912 to a back side 913 of fabrication substrate 908 and in contact with an RDL. The RDL may be in the form of conductive traces 238' formed on the second surface 212' of TWI wafer 960. TWI wafer 960 may also comprise a first plurality of discrete conductive elements 240' formed on and in contact with conductive traces 238'.

The plurality of known good lenses 900' may be respectively peripherally supported on and attached to a plurality of standoffs 242 located on the active surface 912 of fabrication substrate 908, wherein at least one known good lens 900' may be placed over one known good imager die 910. Standoffs 242/242' may be configured to provide support for attached known good lenses 900' and to provide a selected vertical spacing between stacked known good lenses 900'/900" or between known good lenses 900' and TWI wafer 960. Standoffs 242' may also be configured to seal against a temporary carrier 410 and to prevent encapsulant from contacting known good lenses 900'/900" Implementing the configuration described in FIGS. 9 and 10 may improve the yield of an imager die package by ensuring bad lenses are not placed over good imagers and, therefore, decrease the amount of wasted material and component parts. Furthermore, this configuration may ensure that good lenses are not placed over bad imagers.

After placing known good lenses 900'/900" over known good imager die 910, the imager die 910 with the known good lenses 900'/900" attached thereto may be singulated by a dicing operation resulting in a plurality of KGD 510'. As described above, and illustrated in FIG. 11, KGD 510' may include at least one additional known good lens 900" and corresponding standoffs 242" (shown by dashed lines) stacked over known good lens 900' in order to achieve a desired focus onto imager die 910.

Figure 12:
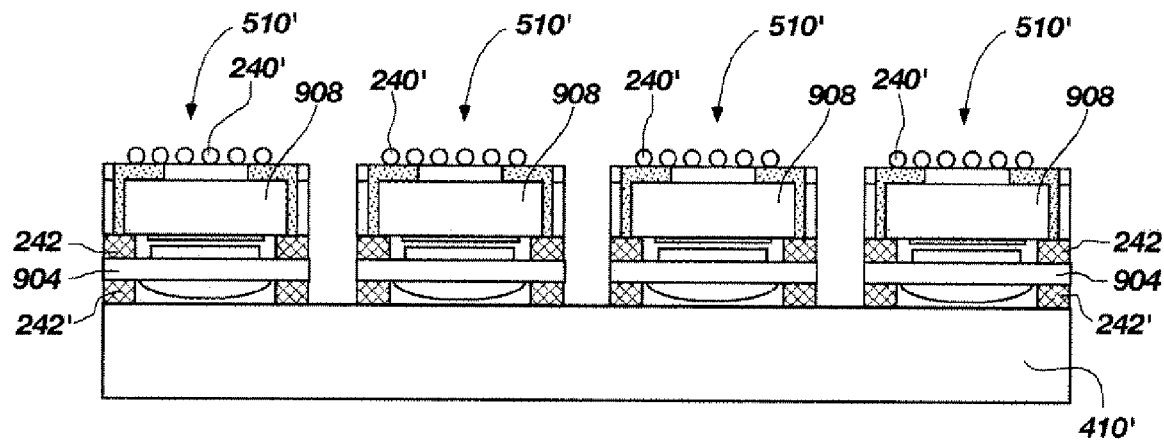
FIG. 12 is a cross-sectional view of a plurality of imager die attached to a temporary carrier in accordance with an embodiment of the invention.
Figure 13:
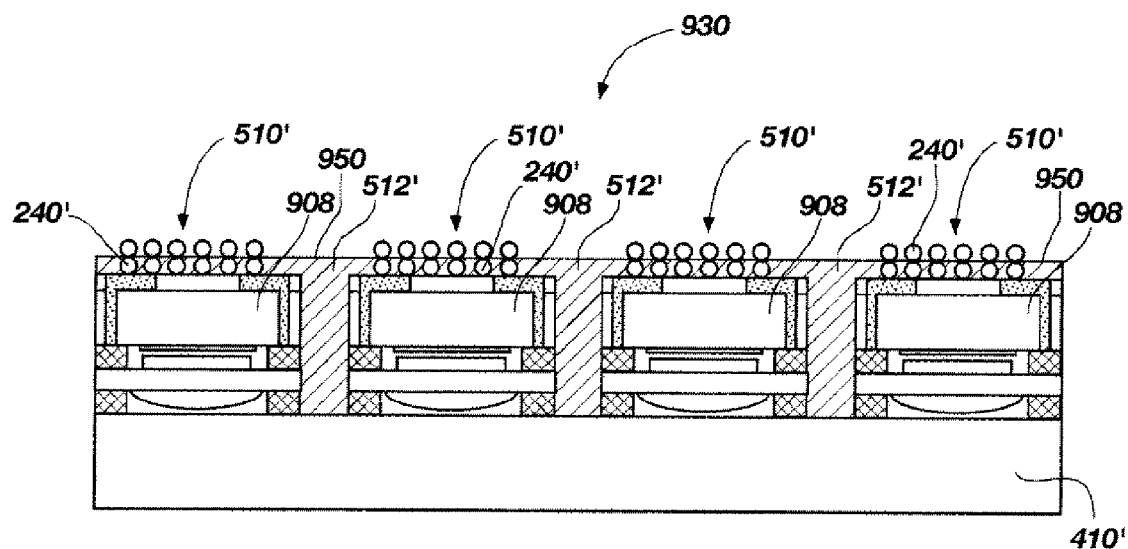
FIG. 13 is a cross-sectional view of a reconstructed wafer including a plurality of encapsulated imager die according to an embodiment of the invention.

Referring to FIG. 12, KGD 510' may be placed face-down on a temporary carrier 410', such as a film frame tape or glass carrier, with standoffs 242' positioned against and secured to temporary carrier 410' to prevent encapsulant from contacting known good lenses 900'/900". As the KGD 510' are placed face down on temporary carrier 410', KGD 510' are shown inverted relative to FIGS. 10 and 11. Once attached to temporary carrier 410', KGD 510' may be encapsulated with encapsulant 512', thus resulting in reconstructed wafer 930, as illustrated in FIG. 13. As described above, encapsulant 512' may comprise any conventional compound known for use in encapsulating semiconductors. Encapsulation processes may include a molding or dam and fill process as known in the art.

Figure 14:
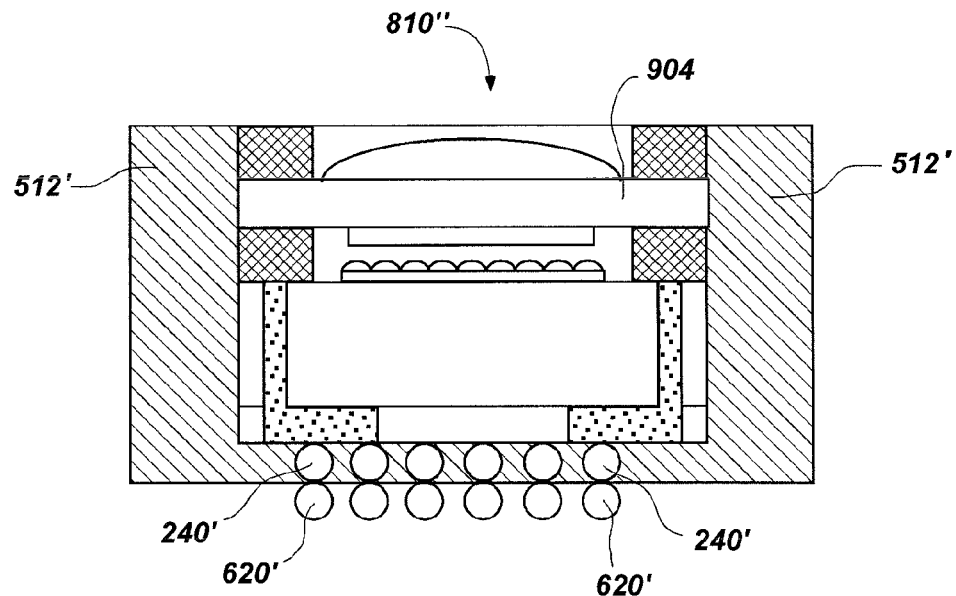
FIG. 14 is a cross-sectional view of a final imager die package in accordance with an embodiment of the invention.

Thereafter, reconstructed wafer 930 may be subjected to appropriate processing to form a substantially planarized surface 950 extending across first set of discrete conductive elements 240' and encapsulant 512'. The processing may further provide for the at least partial exposure of the first plurality of discrete conductive elements 240'. After planarizing surface 950, a second plurality of discrete conductive elements 620', such as balls, bumps, columns, or pins of conductive material (e.g., solder, another metal, a conductor-filled polymer, etc.), may be bonded to the first plurality of discrete conductive elements 240'. The second plurality of discrete conductive elements 620' provides for subsequent attachment to a carrier substrate or other higher-level circuit assembly. As shown in FIG. 14, one discrete element of the second plurality may be operably coupled to one discrete element of the first plurality. As described above, in an embodiment of the invention using a compression molding encapsulation process, at least a portion of the first plurality of discrete conductive elements 240' may remain exposed during a compression molding process and, therefore, neither a planarizing process nor a second plurality of discrete conductive elements may be required.

Subsequent to encapsulation, temporary carrier 410' may be removed and a dicing operation through encapsulation material 512' may be performed, resulting in a final packaged die 810" as shown in FIG. 14.

Figure 15:
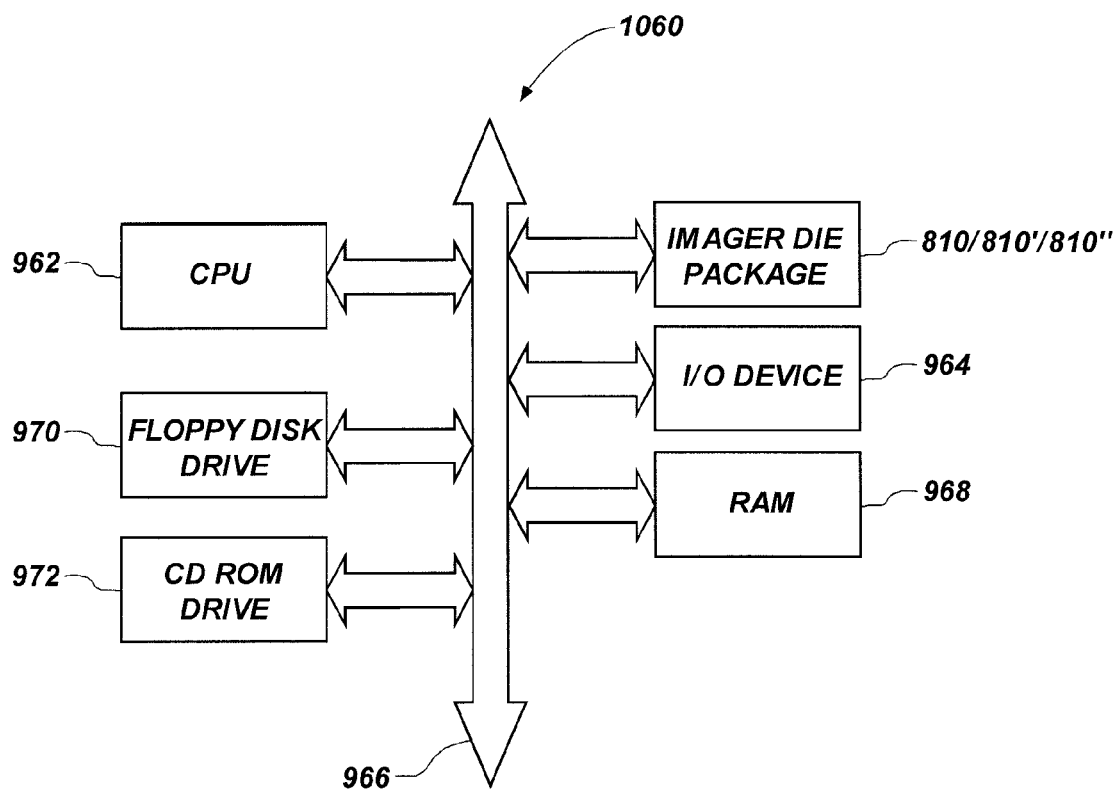
FIG. 15 is an illustration of a system including an imager die package according to an embodiment of the invention.

A processor based system 1060 that includes an imager die package 810/810'/810" in accordance with an embodiment of the present invention is illustrated in FIG. 15. Without being limiting, such a system 1060 may include a computer system, camera system, scanner, machine vision system, vehicle navigation system, video phone, surveillance system, auto focus system, star tracker system, motion detection system, image stabilization system, each of which may be configured to utilize an embodiment of the present invention.

A processor based system 1060, such as a computer system, for example, generally comprises a central processing unit (CPU) 962, for example, a microprocessor, which may communicate with and input/output (I/O) device 964 over a bus 966. The imager die package 810/810'/810" may also communicate with the system 1060 over bus 966. The system 1060 also includes random access memory (RAM) 968, and, in the case of a computer system, may include peripheral devices such as a floppy disk drive 970 and a compact disk (CD) ROM drive 972, which also communicate with CPU 962 over bus 966. CPU 962, imager die package 810/810'/810" and memory 968 may be integrated on a single IC chip.

Specific embodiments have been shown by way of example in the drawings and have been described in detail herein; however, the invention may be susceptible to various modifications and alternative forms. It should be understood that the invention is not intended to be limited to the particular forms disclosed. Rather, the invention includes all modifications, equivalents, and alternatives falling within the spirit and scope of the invention as defined by the following appended claims.

What is claimed is:

1. A method of packaging an imager die, comprising:
   positioning optical elements over respective image sensors of at least some imager dice of a plurality of imager dice carried by a fabrication substrate;
   singulating the at least some imager die from other imager dice of the plurality;
   securing a plurality of singulated imager dice to a temporary carrier with the positioned optical elements secured to or positioned adjacent to the temporary carrier;
   at least partially encapsulating the plurality of singulated imager dice on the temporary carrier to form a reconstructed wafer; and
   singulating at least partially encapsulated imager dice from the reconstructed wafer.

2. The method of claim 1, wherein positioning at least one optical element comprises positioning at least one of a transparent layer and a substrate carrying a plurality of lenses over the fabrication substrate.

3. The method of claim 2, wherein singulating at least some imager die includes forming cuts in the transparent layer or the substrate carrying the plurality of lenses with surfaces of the cuts extend laterally over at least portions of the plurality of imager dice.

4. The method of claim 3, wherein singulating at least some imager die includes forming cuts with laterally extending surfaces that extend substantially to an outer periphery of an image sensor of at least one imager die of the plurality of imager dice.

5. The method of claim 3, wherein singulating the known good dice includes forming cuts that are beveled.

6. The method of claim 3, wherein singulating the known good dice comprises forming cuts with an upper region that is wider than a lower region thereof.

7. The method of claim 3, wherein at least partially encapsulating includes introducing opaque encapsulant material over the laterally extending surfaces of the cuts.

8. The method of claim 1, further comprising:
   testing the plurality of imager die to ascertain known good dice.

9. The method of claim 8, wherein positioning at least one optical element comprises positioning individual known good optical elements only over known good dice.

10. The method of claim 1, further comprising:
    preventing encapsulant from covering at least end portions of discrete conductive elements protruding from the plurality of imager dice.

11. The method of claim 10, wherein preventing comprises receiving at least the end portions of the discrete conductive elements within a compressible, conformable element before at least partially encapsulating the plurality of imager dice.

12. The method of claim 1, further comprising:
    at least partially exposing portions of discrete conductive elements embedded within encapsulant.

13. The method of claim 12, further comprising disposing a second plurality of discrete conductive elements on the at least partially exposed portions of the discrete conductive elements.

14. The method of claim 1, further comprising:
    removing the reconstructed wafer from the temporary carrier.

15. A method of packaging an imager die, comprising:
    dicing through a thickness of a fabrication substrate between adjacent imager die of a plurality of imager dice carried by the fabrication substrate to form a plurality of individual imager die;
    securing a plurality of known good imager die qualified from the plurality of individual imager die to a temporary carrier;
    encapsulating at least partially the plurality of known good imager die on the temporary carrier to form a reconstructed wafer; and
    singulating the at least partially encapsulated plurality of known good imager die from the reconstructed wafer.

16. The method of claim 15, further comprising positioning at least one optical element over the at least one imager die of a plurality of imager dice carried by the fabrication substrate prior to dicing through a thickness of the fabrication substrate.

17. The method of claim 16, wherein positioning at least one optical element over the at least one imager die comprises attaching the at least one optical element to a plurality of standoffs secured to the fabrication substrate.

18. The method of claim 15, wherein securing a plurality of known good imager die qualified from the plurality of individual imager die to a temporary carrier comprises securing a plurality of known good imager die qualified from the plurality of individual imager die to one of a film frame tape and a glass carrier.

19. The method of claim 15, wherein encapsulating at least partially the plurality of known good imager die comprises encapsulating at least partially the plurality of known good imager die with a molding process.

20. The method of claim 19, wherein encapsulating at least partially the plurality of known good imager die with a molding process comprises encapsulating at least partially the plurality of known good imager die with one of a injection molding process, a transfer molding process, and a compression molding process.

21. The method of claim 15, wherein encapsulating at least partially the plurality of known good imager die comprises forming at least one lateral light blocking element extending laterally over a portion of an active surface of each known good imager die.

22. The method of claim 15, wherein encapsulating at least partially the plurality of known good imager die comprises encapsulating at least partially the plurality of known good imager die with a dam and fill process.

23. A method of packaging an imager die, comprising:
    attaching at least one optical element over an active surface of a wafer including a plurality of imager dice, each imager die positioned on the active surface;
    dicing the wafer between adjacent imager die resulting in a plurality of individual imager die;
    securing at least one imager die of the plurality of individual imager die to a temporary carrier;

forming a reconstructed wafer by at least partially encapsulating the at least one imager die on the temporary carrier; and singulating the at least partially encapsulated at least one imager die from the reconstructed wafer.

24. The method of claim 23, wherein attaching at least one optical element over an active surface of a wafer comprises attaching one of a lens and a glass layer over an active surface of a wafer.

25. The method of claim 23, wherein attaching at least one optical element over an active surface of a wafer comprises attaching at least one optical element over an active surface of a through wafer interconnect (TWI) wafer.

* * * * *